United States Patent [19]

Tatematsu

[11] Patent Number: 4,821,238

[45] Date of Patent: Apr. 11, 1989

[54] SEMICONDUCTOR MEMORY DEVICE HAVING TEST PATTERN GENERATING CIRCUIT

[75] Inventor: Takeo Tatematsu, Yokohama, Japan

[73] Assignee: Fujitsu Limited, Kanagawa, Japan

[21] Appl. No.: 895,091

[22] Filed: Aug. 11, 1986

[30] Foreign Application Priority Data

Aug. 14, 1985 [JP] Japan ................................ 60-178961

[51] Int. Cl.[4] ............................................... G11C 7/00
[52] U.S. Cl. ...................................... 365/201; 371/21; 324/73 AT
[58] Field of Search ......................... 365/201; 371/21; 324/73 AT, 73 PC, 158 T, 158 F

[56] References Cited

U.S. PATENT DOCUMENTS

| | | | |
|---|---|---|---|
| 3,805,152 | 4/1974 | Ebersman et al. | 371/21 |
| 3,961,252 | 6/1976 | Eichelberger | 324/73 AT |
| 4,379,259 | 4/1983 | Varadi et al. | 324/73 AT |
| 4,384,348 | 5/1983 | Nozaki | 365/201 |
| 4,553,225 | 11/1985 | Ohe | 365/201 |

Primary Examiner—Joseph A. Popek
Attorney, Agent, or Firm—Armstrong, Nikaido, Marmelstein & Kubovcik

[57] ABSTRACT

A semiconductor memory device comprises an internal circuit including a memory circuit; a test pattern generating circuit; an element for receiving external signals supplied from the outside; and an input switching circuit connected between the test pattern generating circuit and the receiving element, for switching the input supplied to the internal circuit between output signals generating from the test pattern generating circuit and the external signals, the output signals generated from the test pattern generated circuit being input to the internal circuit through the input switching circuit in a test mode, the external signals being input to the internal circuit through the input switching circuit in a usual mode; the test pattern generating circuit, the input switching circuit, and the internal circuit being provided on the same chip.

10 Claims, 7 Drawing Sheets

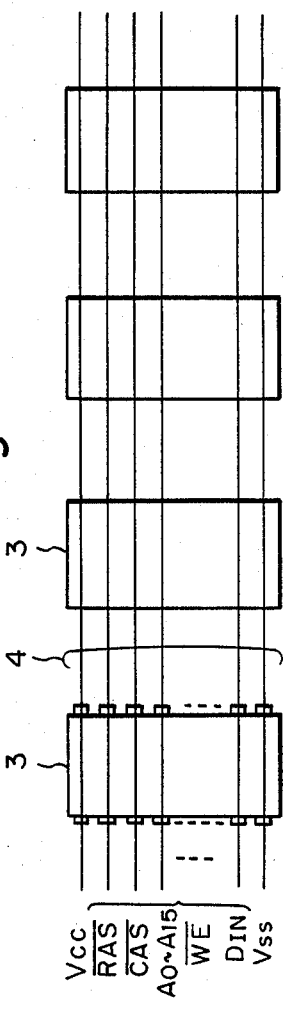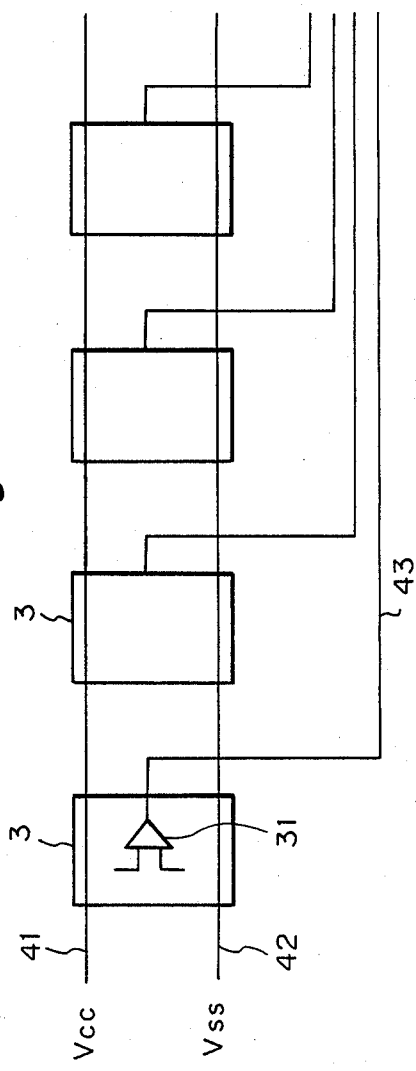

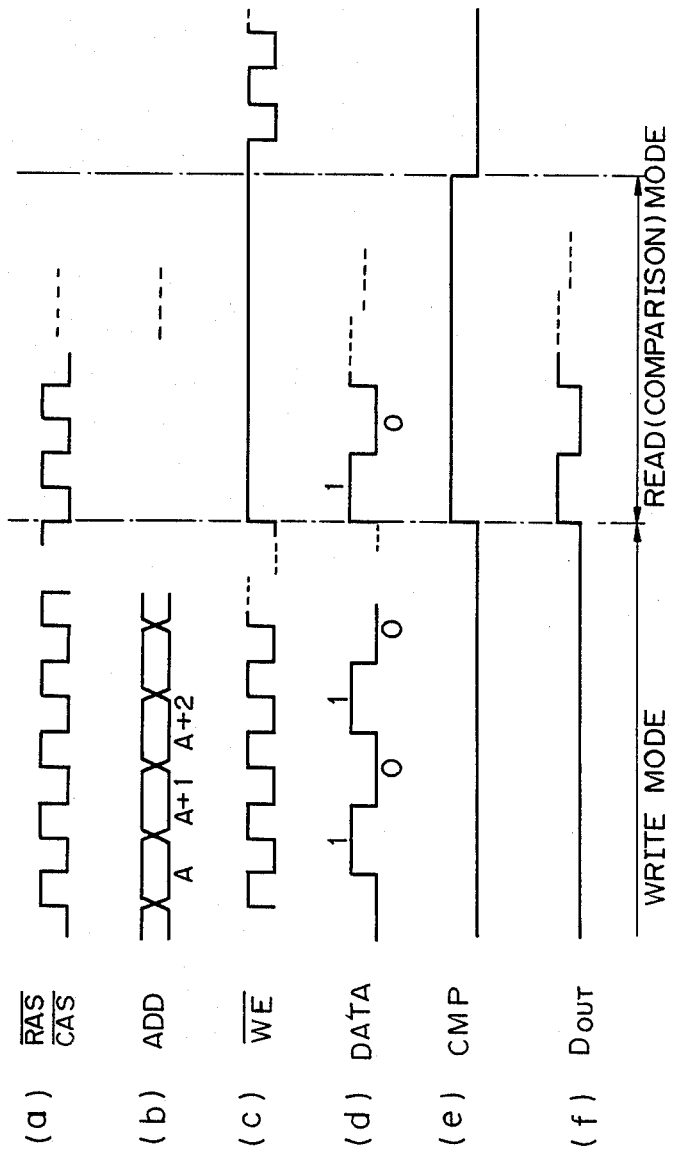

SEMICONDUCTOR MEMORY DEVICE HAVING TEST PATTERN GENERATING CIRCUIT

BACKGROUND OF THE INVENTION

1. Field of the Invention

The present invention relates to a semiconductor memory device having a test pattern generating circuit. Particularly, the present invention relates to a semiconductor memory device having a test pattern generating circuit for carrying out "burn-in", which is a test of the memory devices carried out before final acceptance, as described below.

2. Description of the Related Art

In the manufacturing process of the semiconductor memory devices, many kinds of tests are carried out before the memory devices are finally accepted, in order to discover defective memory devices before that acceptance, and the aging process usually called "burn-in" is carried out as one of the above tests. The above burn-in test is carried out at a certain stage of the following process, that is, assembling, pre-burn-in test, burn-in test (aging), and post-burn-in test (final test). In the above burn-in test, predetermined clock signals (timing signals) such as row and column address strobe signals in an address multiplexed dynamic random-access memory (RAM), address signals, a write enable signal, and write-in data are input to a memory circuit under a high temperature and a high power supply voltage and a check is made of whether or not an obstacle is generated in a certain memory device, which device usually includes a defective memory circuit, a defective memory cell, a defective bonding wire, etc, and only has a short life time.

In this case, the temperature is kept within a range of, for example, 70° to 125° C., and the power supply voltage is set to a value, for example, higher than 6 volts when the standard value of that voltage is 5 volts±10%.

As above-mentioned, the burn-in test is carried out under high temperature and high voltage conditions, and this burn-in test corresponds to a so-called acceleration test.

As a result, an IC chip that will generate a certain obstacle when used in a usual mode must generate such an obstacle (insulation destruction of gate oxide film or electromigration of connection, etc.) when the above burn-in test is carried out. Therefore, IC chips which have generated such an obstacle during the burn-in test are detected by the above final test, which is carried out after the above burn-in test, and these IC chips are removed as the defective products, and thus are prevented from being placed on the market. Thus, an improvement of the reliability of the products is ensured.

At present, as mentioned above, the above burn-in test is carried out for almost all of the semiconductor memory chips before final acceptance, in order to improve the reliability of the products. The burn-in test is carried out by a dynamic operation, and clock signals (row and column address strobe signals), address signals, a write enable signal, and write-in data are supplied from an external input to each of the IC chips (memory chips) in accordance with a predetermined test pattern.

In the prior art, however, as the above signals and the write-in data are supplied to each of the IC chips from a driver circuit provided in an external apparatus for carrying out the burn-in test through connectors provided on the burn-in board, it is impossible to prevent a disturbance by a drive waveform, such as overshoot or undershoot. As a result, the memory circuit provided on each of the IC chips often cannot perform a normal operation, and in the case of a CMOS memory device, when a predetermined negative voltage is generated due to the above undershoot, a thyristor formed by PNPN construction in the memory circuit often turns ON (causes so-called latch-up), and as a result, some of elements in the memory circuit are destroyed. Also, in the prior art, it is necessary to arrange a lot of wiring on the burn-in board and to provide many contact segments in the connectors, and as a result, the construction of the apparatus for carrying out the burn-in test is complicated and the size of the above apparatus is too large.

SUMMARY OF THE INVENTION

The present invention has been completed under the above-mentioned background, and the object of the present invention is to provide a semiconductor memory device having a test pattern generating circuit, particularly a test pattern generating circuit for carrying out a burn-in test, on the same chip as that on which the internal circuit including the memory circuit is provided.

To attain the above object, according to the present invention, there is provided a semiconductor memory device comprising:

an internal circuit including a memory circuit;

a test pattern generating circuit;

means for receiving external signals supplied from the outside; and an input switching circuit connected between the test pattern generating circuit and the receiving means, for switching the input supplied to the internal circuit between output signals generated from the test pattern generating circuit and the external signals, the output signals generated from the test pattern generating circuit being input to the internal circuit through the input switching circuit in a test mode, and the external signals being input to the internal circuit through the input switching circuit in usual mode; wherein the test pattern generating circuit, the input switching circuit circuit, and the internal circuit are provided on the same chip.

According to the present invention, as the test pattern generating circuit and the memory circuit are provided on the same chip, it is not necessary to supply the test pattern to the memory chip from an external apparatus for carrying out the predetermined test. As a result, the above overshoot or undershoot is not generated in the drive waveform even when a number of memory chips are simultaneously tested, and therefore, it is possible to prevent an incorrect operation of the memory circuit, such as the above latch up of the CMOS memory device, and further, it is possible to simplify the construction for carrying out the test for the memory device, and to reduce the size of the device.

BRIEF DESCRIPTION OF THE DRAWINGS

FIG. 2 is a diagram showing the external wiring connecting between the IC chips in the apparatus shown in FIG. 1;

FIG. 4 is a diagram showing the external wiring connecting between the IC chips for carrying out the test according to the present invention;

FIG. 7 is a timing diagram showing the operation in a test mode of the memory device shown in FIG. 6;

DESCRIPTION OF THE PREFERRED EMBODIMENTS

Figure 1:
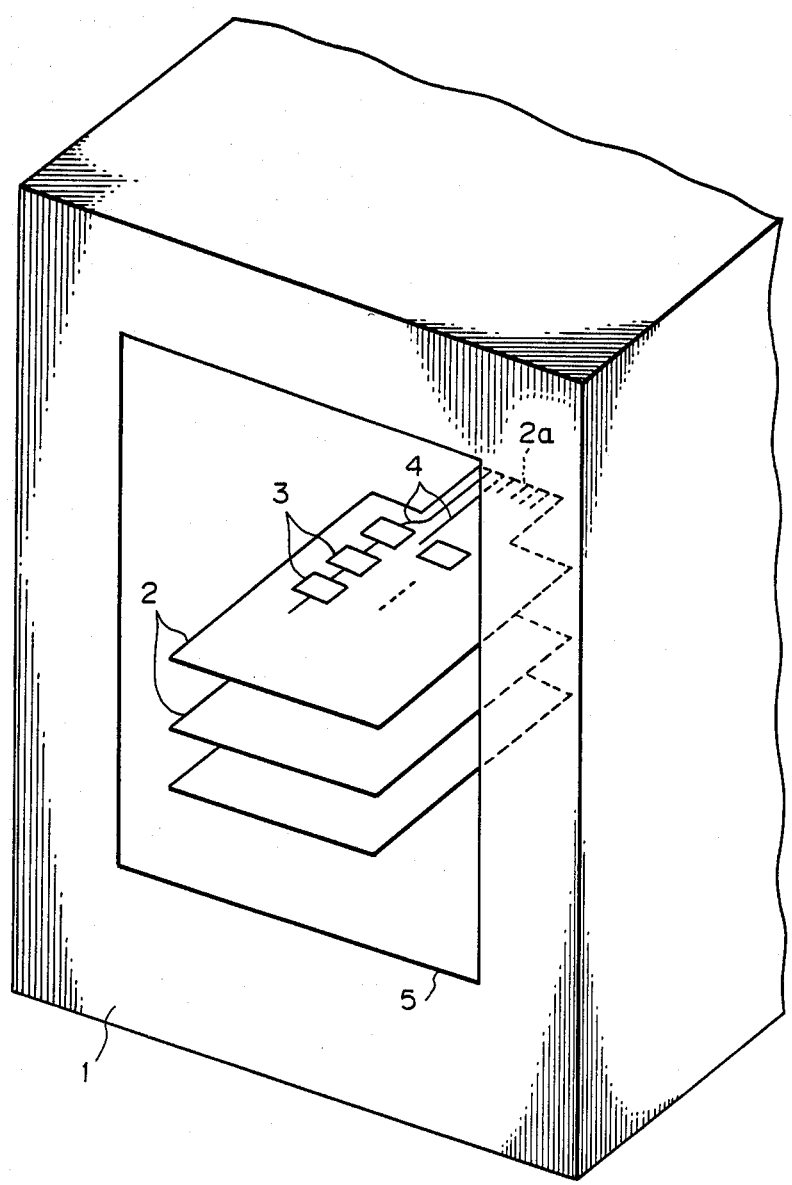
FIG. 1 is a diagram showing the schematic construction of a conventional apparatus for carrying out the burn-in test.

To clarify the background of the present invention, an example of the construction of a conventional apparatus for carrying out the burn-in test is shown in FIG. 1. In FIG. 1, reference numeral 1 shows a constant temperature bath, reference numeral 2 shows a plurality of burn-in boards, and reference numeral 3 shows IC (integrated circuit) chips comprising the memory device; the burn-in test being carried out for each of these chips. The burn-in boards 2 are constructed as printed circuit boards for carrying out the above burn-in test, and a number of sockets for mounting the IC chips 3 which are wired therebetween are provided on each of the burn-in boards 2. Reference numeral 2a shows connectors provided on the end part of each burn-in board 2. A predetermined number of wires 4 is provided in parallel for simultaneously testing all of the IC chips 3.

Also, as shown in FIG. 2, the wires 4 are provided in parallel for supplying the power supply potentials $V_{CC}$ and $V_{SS}$, row and column address strobe signal $\overline{RAS}$ and $\overline{CAS}$, address signals A0 to A15 (in the case of a memory capacity of 64 kilobits), a write enable signal $\overline{WE}$, and write-in data $D_{IN}$ to each of the above IC chips 3.

Thus, a predetermined number of IC chips 3 are inserted to each of the sockets provided on each burn-in board 2, and the connectors 2a provided on each burn-in board 2 are inserted to the connectors provided in the chamber 5. The chamber 5 to which a predetermined number of burn-in boards 2 are inserted is then put in the constant temperature bath 1, and predetermined write-in data (test pattern) $D_{IN}$ is input to each of the IC chips 3 under the above-mentioned temperature and power supply voltage and this write-in data (test pattern) is written in each of the memory cells provided on the IC chips 3.

However, as above-mentioned, in the prior art, as the above signals and the write-in data are supplied to each of the IC chips from the external apparatus for carrying out the burn-in test through the connectors provided on the burn-in board, it is impossible to prevent the disturbance from the drive waveform, such as overshoot or undershoot.

As a result, the memory circuit provided on each of the IC chips cannot often perform a normal operation, and in the case of a CMOS memory device, when a predetermined negative voltage is generated due to the above undershoot, a thyristor formed by PNPN construction in the memory circuit often turns ON (causes so-called latch-up), and as a result, some of the elements in the memory circuit are destroyed. Also, in the prior art, it is necessary to arrange a lot of wiring on the burn-in board and to provide many contact segments in the connectors, and as a result, the construction of the apparatus for carrying out the burn-in test is complicated and the size of the above apparatus is too large.

Figure 3:
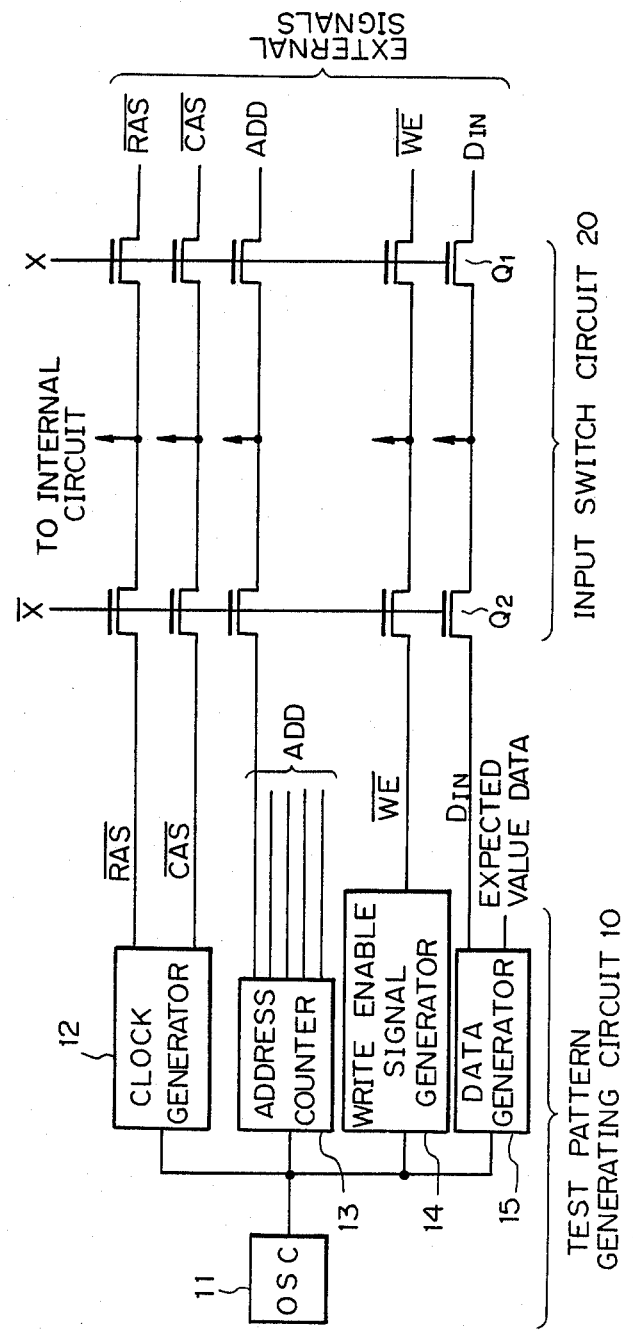
FIG. 3 is a block diagram showing a fundamental principle of the present invention.

The present invention has been completed to solve the above-mentioned problems, and FIG. 3 is a block diagram showing a fundamental principle of the present invention. In FIG. 3, reference numeral 10 is a test pattern generating circuit, and reference numeral 20 is an input switching circuit. A test pattern generating circuit 10 comprises an oscillator 11, a clock generator 12 generating a row address strobe signal $\overline{RAS}$ and column address strobe signal $\overline{CAS}$ on the basis of the pulses generated from the oscillator 11, an address counter 13 counting the pulses generated from the oscillator 11 and generating address signal ADD for the memory circuit, a write enable signal generator 14 generating the write enable signal $\overline{WE}$ on the basis of the pulses generated from the oscillator 11, and a data generator 15 generating write-in data $D_{IN}$ (in this case, a test pattern for carrying out the burn-in test) and expected value data for comparing and checking with corresponding data read out from the memory circuit, on the basis of the pulses generated from the oscillator 11. The input switching circuit 20 comprises a pair of gate transistors $Q_1$ and $Q_2$ in each of the circuits connected to the internal circuit, and switches the input supplied to the internal circuit between the above signals $\overline{RAS}$, $\overline{CAS}$, ADD, and $\overline{WE}$ and the write-in data $D_{IN}$ generated from the test pattern generating circuit 10 and the external signals (row and column address strobe signals $\overline{RAS}$ and $\overline{CAS}$, address signals ADD, write enable signal $\overline{WE}$, and write-in data $D_{IN}$) input from the outside.

The gate transistors $Q_1$ and $Q_2$ of the input switching circuit 20 are controlled by switching signals X and $\overline{X}$ (inverted X signal), and when the potential of the signal X is high and the gate transistor $Q_1$ turns ON, the external signals input from the outside ($\overline{RAS}$, $\overline{CAS}$, ADD, $\overline{WE}$, and $D_{IN}$) are supplied the internal circuit through the input switching circuit 20. This operation corresponds to that in a usual mode. Contrary to this, when the potential of the signal $\overline{X}$ becomes high and the gate transistor $Q_2$ turns ON (the gate transistor $Q_1$ turns OFF), the above signals generated from the test pattern generating circuit 10 are supplied to the internal circuit through the input switching circuit 20. This operation corresponds to that in a test mode.

As the test pattern generating circuit 10 and the input switching circuit 20 are provided on the same chip as that on which the internal circuit including the memory circuit is provided, it is not necessary to provide the wiring from the outside to the chips in order to supply the signals generated from the test pattern generating circuit to the internal circuit including the memory circuit. In other words, it is only necessary to provide two wires 41 and 42 for supplying the power supply potentials $V_{CC}$ and $V_{SS}$ to each of the chips 3 provided on the burn-in board in order to carry out the burn-in test, as shown in FIG. 4. In this connection, however, if the above switching signals X and $\overline{X}$ are supplied from the outside, it is also necessary to provide the wiring for supplying the above switching signals X and $\overline{X}$ from the outside to each of the chips. It is not necessary to provide such wiring for supplying the signals X and $\overline{X}$ if these signals X and $\overline{X}$ are produced on each of the chips. An example of the means for producing the switching signals X and $\overline{X}$ on each of the chips is to provide on the chip the circuit which controls the transistors $Q_1$ and $Q_2$ provided in the input switching circuit 20 so as to operate in a test mode when the power supply potential $V_{CC}$ is increased to more than, for example, 6 volts.

Figure 5:
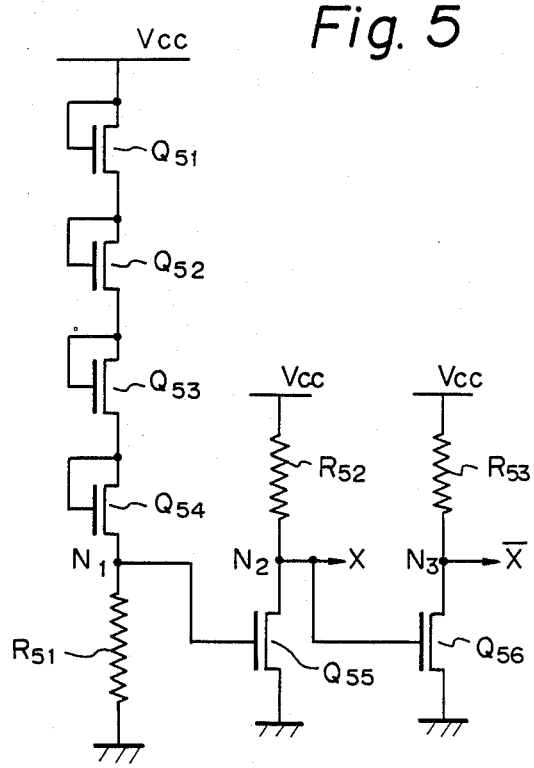
FIG. 5 is a circuit diagram showing an example of the circuit generating switching signals for the input switching circuit used in the present invention.

FIG. 5 shows an example of the circuit which produces the switching signals X and $\overline{X}$ so that the transistors $Q_1$ and $Q_2$ provided in the input switching circuit 20 are switched so as to operate in a test mode when the above potential $V_{CC}$ becomes 7 volts, and to operate in a usual mode when the above potential $V_{CC}$ is, for example, 5 volts.

As shown in FIG. 5, the above circuit comprises four MOS transistors $Q_{51}$ to $Q_{54}$, each of which has a gate and a drain connected in common. These transistors $Q_{51}$ to $Q_{54}$ and a resistor $R_{51}$ are connected in series between the power supply potential $V_{CC}$ and the earth potential. A connecting point $N_1$ between the transistor $Q_{54}$ and the resistor $R_{51}$ is connected to a gate of a MOS transistor $Q_{55}$. A resistor R and the transistor $Q_{55}$ are connected between the power supply potential $V_{CC}$ and the earth potential. A connecting point $N_2$ between the transistor $Q_{55}$ and the resistor $R_{52}$ is connected to a gate of a MOS transistor $Q_{56}$. A resistor $R_{53}$ and the transistor $Q_{56}$ are connected between the power supply potential $V_{CC}$ and the earth potential.

When the power supply potential $V_{CC}$ is supplied to the above circuit shown in FIG. 5, the above transistors $Q_{51}$ to $Q_{54}$ turn ON, and a predetermined potential drop (e.g., 1 volt) is generated between the gate and a source of each of the transistors $Q_{51}$ to $Q_{54}$.

Thus, if the power supply potential $V_{CC}$ is set, for example, 7 volts, the potential of the connecting point $N_1$ becomes 3 volts due to the sum of the above potential drops generated in each of the above transistors $Q_{51}$ to $Q_{54}$, and thus the transistor $Q_{55}$ having a predetermined threshold voltage turns ON, and the potential of the connecting point $N_2$ (namely, the potential of the signal X) becomes low due to the potential drop generated in the resistor $R_{52}$. Further, the transistor $Q_{56}$ turns OFF, and the potential of the connecting point $N_3$ between the resistor $R_{53}$ and the transistor $Q_{56}$ (namely, the potential of the signal $\overline{X}$) becomes high. Thus, the transistor $Q_1$ turns OFF, and the transistor $Q_2$ turns ON, and the input switching circuit 20 is connected to the output side of the test pattern generating circuit 10 so as to operate in a test mode.

Contrary to this, if the power supply potential $V_{CC}$ is set, for example, to 5 volts, the potential of the connecting point $N_1$ becomes 1 volt, and thus the transistor $Q_{55}$ having the predetermined threshold voltage turns OFF, and the potential of the connecting point $N_2$ (namely, the potential of the signal X) becomes high. As a result, the transistor $Q_{56}$ turns ON, and the potential of the connecting point $N_3$ (namely, the potential of the signal $\overline{X}$) becomes low. Thus, the transistor $Q_1$ turns ON, and the transistor $Q_2$ turns OFF, and the input switching circuit 20 is switched so as to receive the external signals from the outside and to operate in a usual mode. Thus, the above circuit generates the predetermined level of the signals X and $\overline{X}$ for switching the input switching circuit 20 from a test mode to a usual mode, or vice versa, in accordance with the potential of the power supply potential $V_{CC}$.

Although the above circuit shown in FIG. 5 uses the potential drops of the MOS transistors $Q_{51}$ to $Q_{54}$ in order to determine the level of the signal X and $\overline{X}$, as above-mentioned, it is also possible to use the forward voltage drops of diodes, for example, instead of the above MOS transistors.

Also, in a dynamic RAM, it is possible to use an address counter usually provided in order to refresh the dynamic RAM, as the above address counter 13 used in a test mode.

Also, if a comparator 31 which compares the expected value data corresponding to data input to the memory circuit in test mode with data output from the memory circuit in test mode is provided on each of the chips 3 and the output signal of the comparator 31 is individually supplied to the external checking circuits by using the wires 43 through a data output pin provided on each of the chips 3, as shown in FIG. 4, it is possible to individually check from the outside whether a certain IC chip 3 is defective or not, and if a predetermined group of the wires 43 are connected in common (so-called wired-OR form), it is possible to check from the outside whether or not the predetermined group of the IC chips 3 includes a defective IC chip 3.

Figure 6:
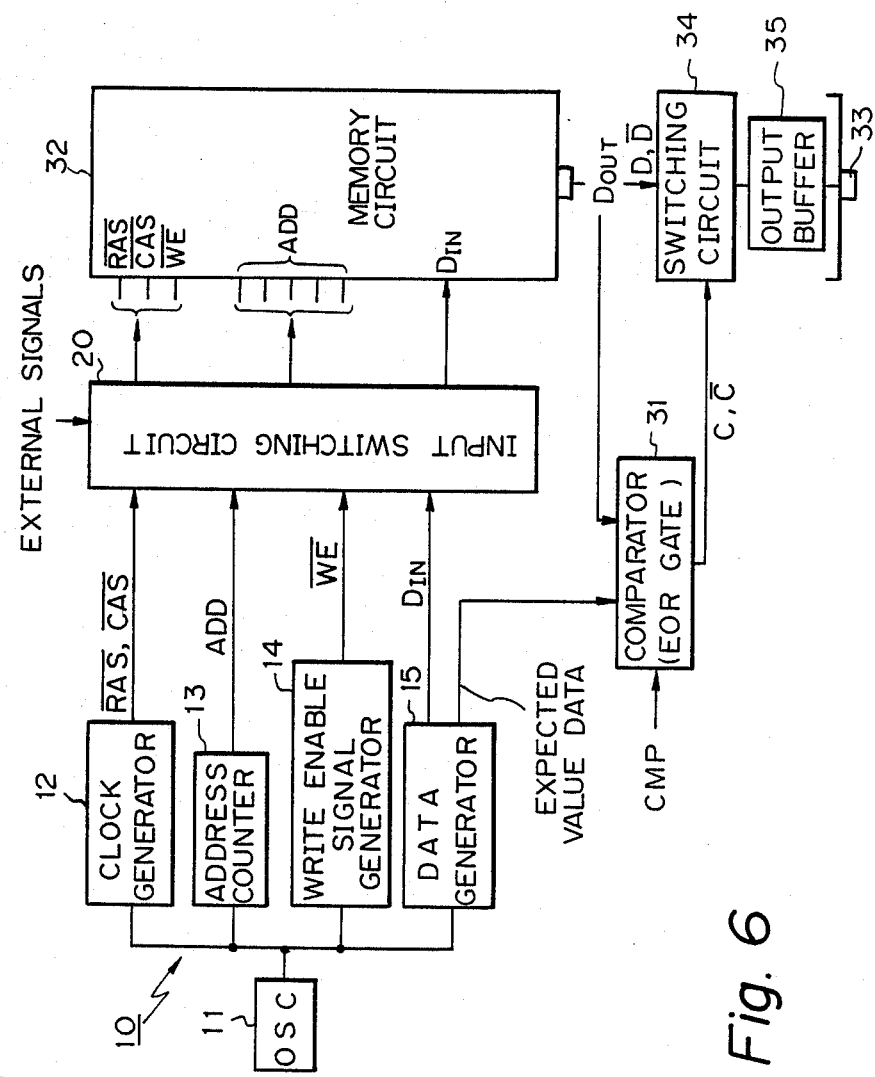
FIG. 6 is a block diagram showing one embodiment of the memory device according to the present invention.

FIG. 6 is a block diagram showing one embodiment of the memory device according to the present invention, and reference numeral 32 corresponds to the memory circuit. Reference numeral 31 is a comparator which compares the expected value data corresponding to write-in data (test pattern data) with output data $D_{OUT}$ read out from the memory circuit 32 in a test mode. In this embodiment, an exclusive OR gate (EOR gate) is used as the comparator 31. The output signal of the comparator (EOR gate) 31 is output to the outside of the chip through a data output terminal 33 through which data read out from the memory circuit 32 in a usual mode is also output.

FIG. 7 is a timing chart showing the operation in a test mode of the above circuit shown in FIG. 6.

When the power supply potential $V_{CC}$ is set, for example, to 7 volts, in order to carry out the burn-in test, the test pattern generating circuit 10 is connected to the internal circuit (memory circuit 32) through the input switching circuit 20, and the row and column address strobe signals $\overline{RAS}$ and $\overline{CAS}$ generated from the clock generator 12, address signals ADD generated from the address counter 13, write enable signal $\overline{WE}$, and the write-in data $D_{IN}$ generated from the data generator 15 are input to the memory circuit 32. As shown in the write mode of FIG. 7, when the burn-in test is carried out, the write-in operation is first carried out, and the predetermined test pattern data formed by alternately changing data between "1" and "0", for example, as shown in FIG. 7(d), generated from the data generator 15 is successively written to the memory cells provided in the memory circuit 32 in accordance with the address signals successively generated from the address counter 13, as shown in FIG. 7(b).

After the predetermined test pattern data has been written to the corresponding memory cells, the operational mode is switched from a write mode to a read (comparison) mode by holding the voltage level of the write enable signal $\overline{WE}$ high, as shown in FIG. 7(c), and by holding the comparator (exclusive OR gate) 31 in an active state (namely by holding the voltage level of the signal CMP high), as shown in FIG. 7(e). Thus, the test pattern data written in the memory cells is successively read out as read data $D_{OUT}$ in accordance with the address signals successively generated from the address counter 13, as shown in FIG. 7(f). Simultaneously, the data generator 15 also generates the corresponding data (namely, the expected value data), as shown in FIG. 7(d). Thus, the above read data $D_{OUT}$ is compared with the above expected value data by the comparator 31. In this case, if the write-in operation in which a predetermined data is written in the corresponding memory cell and the read-out operation in which a predetermined data is read out from the corresponding memory cell are normally performed, the voltage level of the above read data $D_{OUT}$ coincides with the voltage level of the corresponding expected value data, and as a result, the output voltage of the comparator (exclusive OR gate) 31 becomes low level. Contrary to this, if the corresponding memory cell is defective and the above write-in or read-out operation is not normally performed, the voltage level of the above read data $D_{OUT}$ does not coincide with the voltage level of the corresponding expected value data, and as a result, the output voltage of the comparator (exclusive OR gate) 31 becomes high level, and this output voltage of the comparator 31 is supplied to an external circuit through a data output terminal 33 provided on the IC chip 3.

In this connection, as the data read out from the memory circuit 32 in the usual mode is also output through the above data output terminal 33, according to the embodiment shown in FIG. 6, a switching circuit 34 is provided in order to switch the data output through the data output terminal 33 between the above data read out from the memory circuit in a usual mode and the output signal of the comparator 31 generated in a test mode.

Figure 8:
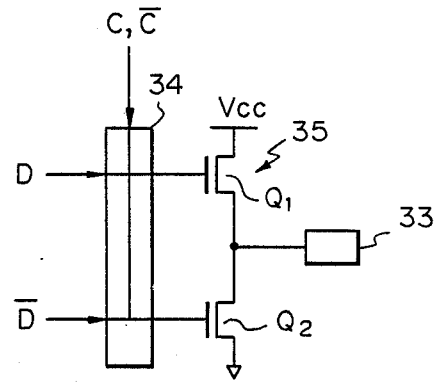
FIG. 8 is a diagram showing an example of the construction of a part of the memory device including a data output terminal shown in FIG. 6.

FIG. 8 shows an example of the construction of a part of the memory device including the data output terminal 33 shown in FIG. 6 in more detail, and reference numeral 35 is an output buffer comprising MOS transistors $Q_1$ and $Q_2$.

Thus, in a usual mode, the data $D_{OUT}$ read out from the memory circuit 32 is input to the output buffer 35 through the switching circuit 34 as a data signal D and an inverted signal $\overline{D}$ of the signal D. Also, in a test mode, the output signal of the comparator 31 is input to the output buffer 35 through the switching circuit 34 as an output signal C and an inverted signal $\overline{C}$ of the signal C. Further, the output signals generated from the output buffer 35 are supplied to the outside through the terminal 33. The switching circuit 34 selects the above signals C and $\overline{C}$ as the input signal when the power supply voltage is, for example, 7 volts, and selects the above signals D and $\overline{D}$ as the input signal when the power supply voltage is, for example, 5 volts. In this connection, the construction of the switching circuit 34 may be a similar construction to the above switching circuit 20 shown in FIG. 3 and FIG. 5, for example.

Figure 9:
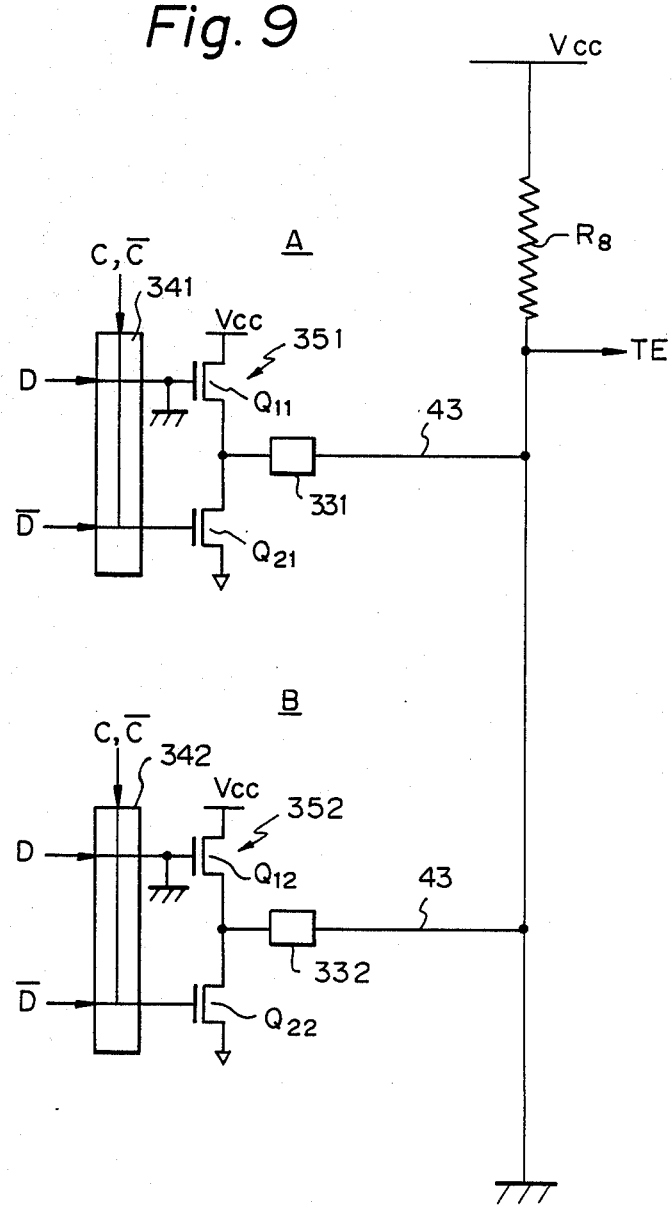
FIG. 9 is a diagram showing an example of the construction in which the wiring is connected in common from each of the data output terminals provided in each of the memory devices to an external circuit.

FIG. 9 shows an example of the construction in which the wires 43 connecting between the data output terminals 331 and 332 provided in the memory devices A and B, and the external circuit including a resistor $R_8$, are connected in common (the above-mentioned wired-OR form). Each memory device comprises the switching circuits 341 and 342, and the output buffers 351 and 352. The output buffers 351 and 352 each comprise transistors $Q_{11}$, $Q_{21}$, and $Q_{12}$, $Q_{22}$. The potential of a gate of each of the transistors $Q_{11}$ and $Q_{12}$ is set to 0 volt, and the transistors $Q_{11}$ and $Q_{12}$ are turned OFF.

Thus, considering the case in which the memory device A is in a test mode, the output signals C and $\overline{C}$ of the comparator 31 provided in the memory device A are supplied to each of the gates of the transistors $Q_{21}$ and $Q_{11}$ through the switching circuit 341.

Thus, if each potential of the output signals C and $\overline{C}$ of the comparator provided in the memory device A becomes low and high, respectively, (namely, the above-mentioned two input data supplied to the comparator provided in the memory device A coincide, and the operation of the memory circuit is normal), the transistor $Q_{21}$ to which the signal C is input turns OFF, and thus the output side of the output buffer 351 comprising the transistors $Q_{11}$ and $Q_{21}$ is brought to a floating (high impedance) state.

In this case, the output side of the output buffer 352 provided in the memory device B is also brought to the floating (high impedance) state, by setting the potential of the column address strobe signal $\overline{CAS}$ supplied to the memory device B to a high level, for example. Thus, no current flows through the external circuit comprising the resistor $R_8$, and the potential of the output signal TE of the external circuit becomes high.

Contrary to this, if each potential of the output signals C and $\overline{C}$ of the comparator provided in the memory device A becomes high and low, respectively, (namely, the above-mentioned two input data supplied to the comparator provided in the memory device A do not coincide, and the operation of the memory circuit is abnormal), the above transistor turns ON, and thus the current flows through the above resistor $R_8$ provided in the external circuit and the transistor $Q_{21}$ provided in the memory device A, (namely, the output side of the output buffer 351 is in a low impedance state). As a result, although the output side of the output buffer 352 provided in the memory device B is in the floating state, the potential of the output signal TE of the external circuit becomes low, due to the potential drop generated in the resistor $R_8$. Thus, it is possible to detect the defective memory device (in this case, the memory device A) through an external source by successively testing a plurality of memory devices A, B, and so on, each of which generates a predetermined output signal at the comparator in accordance with the voltage levels of the two input data supplied to the comparator.

Although the above explanation relates to the operation in a test mode, the output data D and $\overline{D}$ read from the predetermined memory device (for example, the memory device A) is supplied to the output buffer (for example, the output buffer 351) through the switching circuit (for example, the switching circuit 341) in a usual mode, and the potential of the output side of the output buffer (for example, the output buffer 351 provided in the memory device A) is controlled in accordance with the potential of the above-mentioned output data supplied from the corresponding memory cell in a usual mode.

I claim:

1. A semiconductor memory device comprising:
    an internal circuit including a memory circuit having a plurality of memory cells;
    a test pattern generating circuit for generating output signals, said test pattern generating circuit including an address generating means, having an internal address counter, for generating address signals for accessing each memory cell in said memory circuit;
    receiving means for receiving external signals including external address signals; and
    an input switching circuit means, connected between said test pattern generating circuit and said receiving means, for switching said external signals, including said external address signals to the memory circuit of said internal circuit in a usual mode, and for switching said output signals, including said generated address signals from said test pattern generating circuit to the memory circuit of said internal circuit in a test mode, wherein the operation of the test mode and the usual mode are mutually exclusive one of another;

said test pattern generating circuit, said input switching circuit, and said internal circuit being provided on a same chip.

2. A semiconductor memory device according to claim 1, wherein said test pattern generating circuit comprises a write enable signal generator and a data generator for generating write-in data and expected value data corresponding to said write-in data.

3. A semiconductor memory device according to claim 1, wherein said test pattern generating circuit comprises a clock generator for generating a timing signal for determining access timing to said memory circuit.

4. A semiconductor memory device according to claim 3, wherein said clock generator comprises means for generating a row address strobe signal and a column address strobe signal as said timing signal.

5. A semiconductor memory device according to claim 1, wherein said means for receiving external signals further comprises means for receiving a write enable signal and write-in data.

6. A semiconductor memory device according to claim 5, wherein said means for receiving external signals further comprises means for receiving a timing signal for determining access timing to said memory circuit.

7. A semiconductor memory device according to claim 6, wherein said means for receiving a timing signal comprises means for receiving a row address strobe signal and a column address strobe signal.

8. A semiconductor memory device according to claim 1, wherein said input switching circuit means is switched by switching signals supplied from an external source from said test mode to said usual mode, or vice versa.

9. A semiconductor memory device according to claim 1, wherein said test pattern generating circuit is provided for carrying out a burn-in test.

10. A semiconductor memory device according to claim 1, wherein said input switching circuit means includes means for controlling said input switching circuit means, such that said external signals are switched to said memory circuit for operating in the usual mode when a power supply potential supplied to the input switching circuit means is in a predetermined range, and such that said output signals generated from said test pattern generating circuit are switched to said internal circuit in the test mode when said power supply potential is increased to exceed said predetermined range.

* * * * *